United States Patent
Jadus et al.

(10) Patent No.: US 6,288,608 B1
(45) Date of Patent: Sep. 11, 2001

(54) RADIO FREQUENCY POWER AMPLIFIER FOR A BATTERY POWERED HANDSET UNIT OF A WIRELESS COMMUNICATIONS SYSTEM

(75) Inventors: Dale K. Jadus, Wappinger Falls; James M. Moniz, Poughquag, both of NY (US); Joseph Pusl, Leucadia, CA (US); Colin Ruhe, Beaverton, OR (US); Carl Stuebing, Mahwah, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/561,305

(22) Filed: Apr. 28, 2000

(51) Int. Cl.[7] ........................................... H03F 3/68
(52) U.S. Cl. ..................... 330/124 R; 330/51; 330/129; 330/295
(58) Field of Search ................................. 330/51, 124 R, 330/129, 295

(56) References Cited

U.S. PATENT DOCUMENTS 4,598,252 * 7/1986 Andricos ................................ 330/51
5,256,987 * 10/1993 Kibayashi et al. ................... 330/295
5,629,648   5/1997 Pratt ...................................... 330/289
5,872,481   2/1999 Sevic et al. ............................ 330/51

FOREIGN PATENT DOCUMENTS

9139711 * 5/1997 (JP) .................................. 330/124 R

OTHER PUBLICATIONS

Gray, Paul R. and Meyer, Robert G., Analysis and Design of Analog Integrated Circuits, 1993, pp. xiv, 269–343.
Maxim 19–1524; Rev 2; Nov. 1999. 2.7V, Single–Supply, Cellular–Band Linear Power Amplifiers, 16 pp. .

* cited by examiner

Primary Examiner—Michael B Shingleton
(74) Attorney, Agent, or Firm—Ratner & Prestia; Joseph P. Abate, Esq.

(57) ABSTRACT

A radio frequency power amplifier for a battery powered handset unit of a wireless communications system having a low power signal amplification path and a high power signal amplification path. Logic and biasing means within the handset select between the low power signal path and the high power signal depending upon the handset being within or outside a prescribed distance from a base station. In this way, the signals received at the base station from the handset are at the required power level.

4 Claims, 2 Drawing Sheets

RADIO FREQUENCY POWER AMPLIFIER FOR A BATTERY POWERED HANDSET UNIT OF A WIRELESS COMMUNICATIONS SYSTEM

TECHNICAL FIELD

The present invention relates, in general, radio frequency power amplifiers and, in particular, to a radio frequency power amplifier having an improved efficiency and adapted for use in a battery powered handset unit of a wireless communications system.

BACKGROUND OF THE INVENTION

The efficiency of the radio frequency power amplifier used in a battery powered handset unit of a wireless communications system is a major consideration because this power amplifier is the largest power load on the battery. The higher the efficiency of the power amplifier, the longer time use of the battery powered handset without a recharge.

For a J-CDMA power amplifier, the unit should meet the accepted performance standards for power amplifier efficiency, gain and adjacent channel power ratio (ACPR) at full power (i.e., +27 dBm), while providing exceptionally good efficiency at lower power (i.e., +13 dBm).

Typical prior art implementations of 27 dBm to 28 dBm power amplifiers provide gains on the order of 28 dB, power amplifier efficiency on the order of 32% for GaAs MOSFET (Anadigics). It is believed that exotic and costly technologies like GaAs PHMET could achieve 45% to 50% power amplifier efficiency in such prior art configuration at full power.

SUMMARY OF THE INVENTION

It is an objective of the present invention to provide a new and improved radio frequency power amplifier for a battery powered handset unit of a wireless communications system.

It is another objective of the present invention to provide a radio frequency power amplifier for a battery powered handset unit of a wireless communications system that overcomes deficiencies of prior art radio frequency power amplifiers of this type.

To achieve these and other objectives, a radio frequency power amplifier for a battery powered handset unit of a wireless communications system, constructed in accordance with the present invention, includes means for supplying a radio frequency signal, a low power signal path having: a first radio frequency amplifier for amplifying the radio frequency signal and a first control switch for controlling passage of the radio frequency signal through the low power signal path to a first output; and a high power signal path having a second radio frequency amplifier for amplifying the radio frequency signal and a second control switch for controlling passage of the radio frequency signal through the high power signal path to a second output. This radio frequency power amplifier also includes bias and logic means for: (a) controlling the first control switch to permit passage of the radio frequency signal through the low power signal path when the handset is located within a prescribed distance from a base station and prevent passage of the radio frequency signal through the low power signal path when said handset is located outside the prescribed distance from the base station, (b) biasing the first radio frequency amplifier to amplify the radio frequency signal when the handset is located within the prescribed distance from the base station and prevent amplification of the radio frequency signal by the first radio frequency amplifier when the handset is located outside the prescribed distance from the base station, (c) controlling the second control switch to permit passage of the radio frequency signal through the high power signal path when the handset is located outside the prescribed distance from the base station and prevent passage of the radio frequency signal through the high power signal path when the handset is located within the prescribed distance from the base station, and (d) biasing the second radio frequency amplifier to amplify the radio frequency signal when the handset is located outside the prescribed distance from the base station and prevent amplification of the radio frequency signal by the second radio frequency amplifier when the handset is located within the prescribed distance from the base station. This radio frequency power amplifier further includes means for coupling together the first output and the second output.

BRIEF DESCRIPTION OF THE DRAWINGS

The invention is best understood from the following detailed description when read in conjunction with the accompanying drawings.

DETAILED DESCRIPTION OF THE INVENTION

Figure 1:
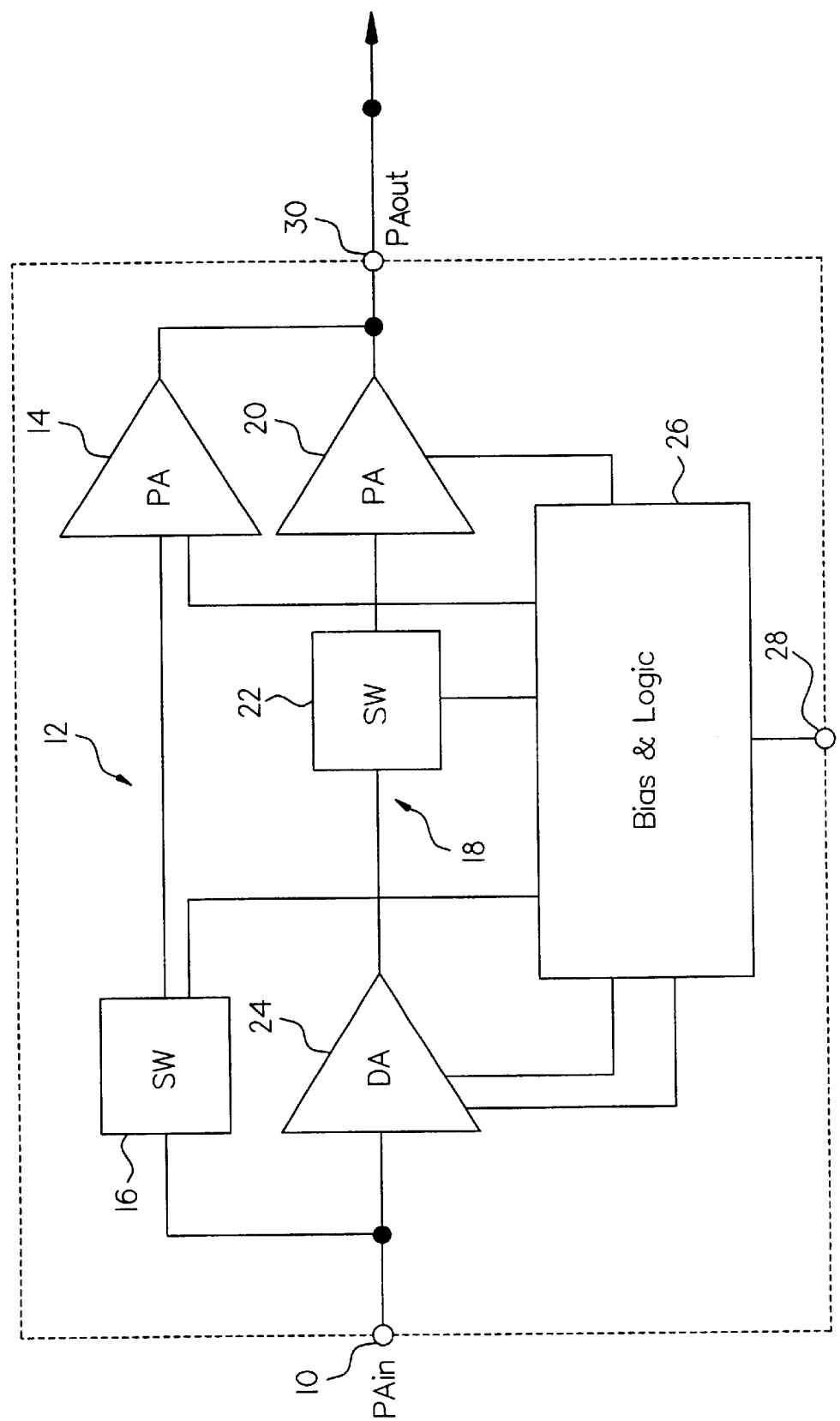
FIG. 1 is a block diagram of a radio frequency power amplifier for a battery powered handset unit of a wireless communications system constructed in accordance with the present invention.

Referring to FIG. 1, a radio frequency power amplifier for a battery powered handset unit of a wireless communications system, constructed in accordance with the present invention, includes means for supplying a radio frequency signal. Such means include a terminal 10 to which a radio frequency signal is conducted from an audio source and modulator that are not shown in FIG. 1.

A radio frequency amplifier, constructed in accordance with the present invention, further includes a low power signal path 12 having a first radio frequency power amplifier 14 of conventional design for amplifying the radio frequency signal and a first control switch 16 of conventional design for controlling passage of the radio frequency signal through the low power signal path to a first output; namely the output of first radio frequency power amplifier 14. For the embodiment of the present invention shown in FIG. 1, control switch 16 is a series switch.

A radio frequency amplifier, constructed in accordance with the present invention, further includes a high power signal path 18 having a second radio frequency power amplifier 20 of conventional design for amplifying the radio frequency signal and a second control switch 22 of conventional design for controlling passage of the radio frequency signal through the high power signal path to a second output; namely the output of second radio frequency power amplifier 20. For the embodiment of the present invention shown in FIG. 1, control switch 22 is a shunt switch.

For the embodiment of the invention illustrated in FIG. 1, high power signal path 18 also includes a drive radio frequency amplifier 24 of conventional design upstream of second radio frequency power amplifier 20. Drive radio frequency amplifier 24 is included in high power signal path 18 to support the higher gain required by providing an amplified radio frequency signal to second radio frequency amplifier 20. Second control switch 22 in high power signal path 18 is disposed between second radio frequency power amplifier 20 and drive radio frequency amplifier 24. Thus, high power signal path 18 has two stages of amplification. In contrast, low power signal path 12 has only one stage of amplification.

A radio frequency amplifier, constructed in accordance with the present invention, also includes bias and logic means 26 for controlling first control switch 16, biasing first radio frequency power amplifier 14, controlling second control switch 22, and biasing second radio frequency power amplifier 20. Specifically, bias and logic means 26 are arranged, by employing conventional design techniques, to:

(1) control first control switch 16 to either permit passage of the radio frequency signal through low power signal path 12 or prevent passage of the radio frequency signal through low power signal path 12, (2) bias first radio frequency power amplifier 14 to either amplify the radio frequency signal or prevent first radio frequency power amplifier 14 from amplifying the radio frequency signal, (3) control second control switch 22 to either permit passage of the radio frequency signal through high power signal path 18 or prevent passage of the radio frequency signal through high power signal path 18, and (4) bias second radio frequency power amplifier 20 to either amplify the radio frequency signal or prevent second radio frequency power amplifier 20 from amplifying the radio frequency signal.

CDMA operation calls for the same power level of signals received at the base station from handsets within the cell. In accordance with the present invention, bias and logic means 26 control selecting between low power signal path 12 and high power signal path 18 to assure that the signals received at the base station from the handset are at the required power level. This selection is accomplished by the handset sensing by the reception of a signal from the base station whether the base station is receiving signals from the handset at the required power level and by bias and logic means 26 switching, in response to a control signal applied at a terminal 28, between low power signal path 12 and high power signal path 16, as needed, to transmit signals from the hand set to the base station at the required power level.

To run low power signal path 12, first control switch 16, a series switch in the low power signal path, is turned on by bias and logic means 26 to permit the radio frequency signal to pass to first radio frequency power amplifier 14. At the same time, bias and logic means 26 applies a bias to first radio frequency power amplifier 14 to permit the first radio frequency power amplifier to amplify the radio frequency signal. Meanwhile, to not run high power signal path 18 and conserve power by second radio frequency power amplifier 20 not drawing power, second control switch 22, a shunt switch in the high power signal path 18, is turned on by bias and logic means 26 to connect the second radio frequency power amplifier to ground and prevent the radio frequency signal from passing to the second radio frequency power amplifier. At the same time, bias and logic means 26 disconnect a bias from second radio frequency power amplifier 20 and drive radio frequency amplifier 24 to prevent the second radio frequency power amplifier from amplifying the radio frequency signal and the drive radio frequency amplifier from amplifying the radio frequency signal.

To run high power signal path 18, second control switch 22, a shunt switch in the high power signal path, is turned off by bias and logic means 26 to disconnect second radio frequency power amplifier 20 from ground and permit the radio frequency signal to pass to the second radio frequency amplifier. At the same time, bias and logic means 26 connects a bias to second radio frequency power amplifier 20 and drive radio frequency amplifier 24 to permit the second radio frequency power amplifier to amplify the radio frequency signal and the drive radio frequency amplifier to amplify the radio frequency signal. Meanwhile, to not run low power signal path 12 and conserve power by first radio frequency power amplifier 14 not drawing power, first control switch 16, a series switch in the low power signal path, is turned off by bias and logic means 26 to prevent the radio frequency signal from passing to the first radio frequency power amplifier. At the same time, bias and logic means 26 disconnects a bias from first radio frequency power amplifier 14 to prevent the first radio frequency power amplifier from amplifying the radio frequency signal.

A radio frequency power amplifier, constructed in accordance with the present invention, further includes means for coupling together the first output, namely the output of first radio frequency power amplifier 14, and the second output, namely the output of second radio frequency power amplifier 20. The outputs of the two radio frequency power amplifiers 14 and 20 are connected together at a terminal 30 from which the signals from the radio frequency power amplifiers are conducted to an antenna that is not shown in FIG. 1. In CDMA applications, to protect the radio frequency power amplifier against reflected power due to impedance mismatches at the antenna, a circulator or isolator, neither of which are shown in FIG. 1, are typically positioned between the radio frequency power amplifier and the antenna.

Figure 2:
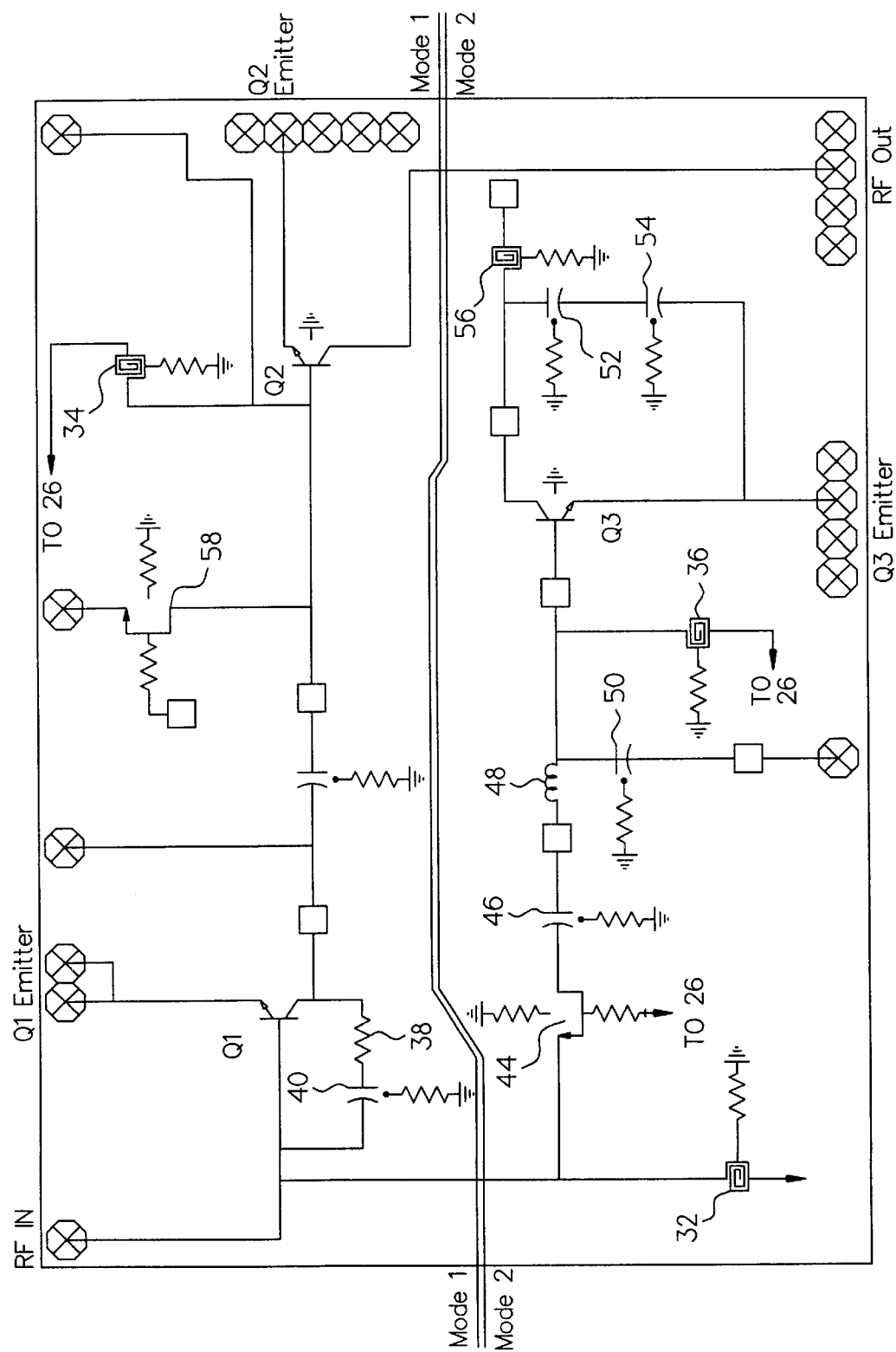
FIG. 2 is a schematic diagram of the amplifier and switch portions of a radio frequency power amplifier for a battery powered handset unit of a wireless communications system constructed in accordance with the present invention.

Modifications in the implementation of the radio frequency amplifier, constructed in accordance with the FIG. 1 block diagram can impact the tradeoffs between performance at 27 dBm and performance at 13 dBm. Referring to the schematic diagram of FIG. 2, the upper half, identified as "MODE 1," corresponds to high power signal path 18 of the FIG. 1 radio frequency amplifier and the lower half, identified as "MODE 2," corresponds to low power signal path 12 of the FIG. 1 radio frequency amplifier. Biasing is applied to three radio frequency amplification transistors Q1, Q2, and Q3 (corresponding reference numerals 24, 20 and 14, respectively, in FIG. 1) through three integrated inductors 32, 34, and 36, respectively.

For MODE 1 (high power signal path 18) operation, RC shunt feedback by resistor 38 and capacitor 40 is utilized to ensure stability. Series C and shunt L elements, namely capacitor 42 and inductor 34, are used to provide interstage matching.

For MODE 2 (low power signal path 12) operation, a series NFET control switch 44, corresponding to switch 16 of FIG. 1, couples the input radio frequency signal to a DC blocking capacitor 46. Additional tuning means, composed of a parasitic inductor 48, a capacitor 50 and inductor 36, serve to establish impedance matching in the low power signal path.

If lower power performance is favored, as shown shunt capacitors 52 and 54 and a series inductor 56 are added between the low power signal path and the high power signal path. This ensures a proper impedance transformation from the low power signal path reference plane to the reference plane of the high power signal path that it is matched to on the board while the high power signal path is in operation.

However, higher performance in the high power signal path can be achieved if this interstage match is eliminated and the OFF power signal path is directly coupled.

Putting the lower power signal path control switch 16 (reference numeral 44 in FIG. 2) on the input side of first radio frequency power amplifier 14 instead of on the output side of first radio frequency power amplifier 14 is important because the voltage tolerance, typically of 0.5 $\mu$m CMOS (3.6V), is otherwise problematic with voltage swings on the order of, for example, 8 volts or so (under maximum power supply and highest VSWR buffered by a circulator). Likewise, putting the higher power signal path control switch 22 (reference numeral 58 in FIG. 2) on the input side of second radio frequency power amplifier 20 instead of the output side of the second radio frequency power amplifier 20 avoids similar problems and provides similar benefits.

Furthermore, total power loss in the switch is significantly reduced when the switch is operating at a lower power level instead of at a higher power level. By separating the two signal paths, it is possible, and preferred, to use a transistor with a higher cutoff frequency (Ft) and a lower breakdown voltage in the high power signal path input stage. This allows better efficiency verses linearity for that mode without having voltage tolerance problems. However, this requires a separate 3 volt supply because 4.5 volts on a battery would damage that device.

Finally, it should be noted that when the second radio frequency power amplifier 20 is not in use and is shorted to ground, the linearity of the transistor in use (i.e., the transistor in the first radio frequency power signal path) is improved because a clean short is presented instead of a non-linear capacitive load.

Although illustrated and described herein with reference to certain exemplary embodiments, the present invention, nevertheless, is not intended to be limited to the details shown and described. Rather, various modifications may be made to those exemplary embodiments within the scope and range of equivalents of the claims without departing from the invention.

What is claimed:

1. A radio frequency power amplifier for a battery powered handset unit of a wireless communications system comprising:

means for supplying a radio frequency signal;

a low power signal path having:
   (a) a first radio frequency power amplifier for amplifying the radio frequency signal, and
   (b) a first control switch for controlling passage of the radio frequency signal through said low power signal path to a first output;

a high power signal path having:
   (a) a second radio frequency power amplifier for amplifying the radio frequency signal, and
   (b) a second control switch for controlling passage of the radio frequency signal through said high power signal path to a second output;

bias and logic means for:
   (a) controlling said first control switch to permit passage of the radio frequency signal through said low power signal path when said handset is located within a prescribed distance from a base station and prevent passage of the radio frequency signal through said low power signal path when said handset is located outside the prescribed distance from the base station,
   (b) biasing said first radio frequency power amplifier to amplify the radio frequency signal when said handset is located within the prescribed distance from the base station and prevent amplification of the radio frequency signal by said first radio frequency power amplifier when said handset is located outside the prescribed distance from the base station,
   (c) controlling said second control switch to permit passage of the radio frequency signal through said high power signal path when said handset is located outside the prescribed distance from the base station and prevent passage of the radio frequency signal through said high power signal path when said handset is located within the prescribed distance from the base station, and
   (d) biasing said second radio frequency power amplifier to amplify the radio frequency signal when said handset is located outside the prescribed distance from the base station and prevent amplification of the radio frequency signal by said second radio frequency power amplifier when said handset is located within the prescribed distance from the base station; and means for coupling together said first output and said second output.

2. A radio frequency power amplifier according to claim 1 wherein said high power signal path has a third radio frequency amplifier upstream of said second radio frequency power amplifier for amplifying the radio frequency signal.

3. A radio frequency power amplifier according to claim 2 wherein said second control switch in said high power signal path is disposed between said second radio frequency power amplifier and said third radio frequency amplifier.

4. A radio frequency power amplifier according to claim 1 wherein:
   (a) said first control switch in said low power signal path is turned on by said bias and logic means to permit the radio frequency signal to pass to said first radio frequency power amplifier when said handset is located within the prescribed distance from the base station,
   (b) said second control switch in said high power signal path is turned on by said bias and logic means to connect said second radio frequency power amplifier to ground and prevent the radio frequency signal from passing to said second radio frequency power amplifier when said handset is located within the prescribed distance from the base station,
   (c) said second control switch in said high power signal path is turned off by said bias and logic means to disconnect said second radio frequency power amplifier from ground and permit the radio frequency signal to pass to said second radio frequency power amplifier when said handset is located outside the prescribed distance from the base station, and
   (d) said first control switch in said low power signal path is turned off by said bias and logic means to prevent the radio frequency signal from passing to said first radio frequency power amplifier when said handset is located outside the prescribed distance from the base station.

* * * * *